United States Patent [19]

Soejima

[11] Patent Number: 4,927,776
[45] Date of Patent: May 22, 1990

[54] METHOD OF PRODUCING SEMICONDUCTOR INTEGRATED CIRCUIT DEVICE INCLUDING BIPOLAR TRANSISTOR AND INSULATED GATE FIELD EFFECT TRANSISTOR

[75] Inventor: Katsumoto Soejima, Tokyo, Japan

[73] Assignee: NEC Corporation, Tokyo, Japan

[21] Appl. No.: 270,434

[22] Filed: Nov. 8, 1988

Related U.S. Application Data

[63] Continuation of Ser. No. 920,009, Oct. 17, 1986, abandoned.

[30] Foreign Application Priority Data

Oct. 17, 1985 [JP] Japan .................................. 60-232671

[51] Int. Cl.[5] .......................................... H01L 21/265
[52] U.S. Cl. ........................................ 437/33; 437/31; 437/59; 437/41; 437/162; 357/43; 357/59
[58] Field of Search ....................... 437/31, 32, 33, 228, 437/233, 51, 59, 41, 34, 57, 46; 357/34, 43, 59 H; 148/DIG. 9, DIG. 10, DIG. 11

[56] References Cited

U.S. PATENT DOCUMENTS 4,484,388 11/1984 Iwasaki .
4,536,945 8/1985 Gray .
4,637,125 1/1987 Iwasaki .

FOREIGN PATENT DOCUMENTS

186359 10/1984 Japan .

Primary Examiner—Brian E. Hearn
Assistant Examiner—Kevin McAndrews
Attorney, Agent, or Firm—Sughrue, Mion, Zinn, Macpeak & Seas

[57] ABSTRACT

A method of producing an integrated circuit device having a bipolar transistor and P-channel and N-channel MOS transistors (Bi-CMOS IC) is disclosed. This method includes the steps of forming a collector contact hole, depositing a polycrystalline silicon layer after formation of the collector contact hole, and diffusing impurities through the polycrystalline silicon layer into a collector region through the collector contact hole to form a collector contact region. The polycrystalline silicon layer doped with impurities is employed as a collector electrode and gate electrodes. The impurities in the collector contact region are re-diffused into the collector region by the subsequent heat treatments used in forming an emitter region and source and drain regions of the respective MOS transistors. A Bi-CMOS IC in which the collector resistance of the bipolar transistor is lowered is thereby produced without a great increase in manufacturing steps.

6 Claims, 5 Drawing Sheets

FIG 16

METHOD OF PRODUCING SEMICONDUCTOR INTEGRATED CIRCUIT DEVICE INCLUDING BIPOLAR TRANSISTOR AND INSULATED GATE FIELD EFFECT TRANSISTOR

This is a continuation of application Ser. No. 06/920,009 filed Oct. 17, 1986 now abandoned.

BACKGROUND OF THE INVENTION

The present invention relates to a semiconductor device in which a bipolar transistor and an insulated gate field effect transistor (hereinafter, "MOS transistor") are formed on a single chip, and more particularly to a method of producing a semiconductor integrated circuit device including a bipolar transistor and an MOS transistor whose substrate region has a conductivity type opposite to that of a collector region of the bipolar transistor.

The integrated circuit including bipolar and MOS transistors is called a Bi-MOS IC and features the high speed operation of bipolar transistors and the high integration density of an MOS transistor. One type of Bi-MOS IC includes both P-channel and N-channel MOS transistors and is known as a Bi-CMOS IC. This device has the advantage of low power consumption in addition to high speed and high integration density.

In an integrated circuit device, regions of the same conductivity type are formed simultaneously in order to reduce manufacturing steps. In a case where the conductivity type of the substrate region of the MOS transistor is different from that of the collector region of the bipolar transistor, source and drain regions of that MOS transistor are formed simultaneously with an emitter region and a collector contact region of the bipolar transistor. The emitter region and the source and drain regions are formed with a shallow junction in order to enhance the integration density. As a result, the collector contact region is similarly made shallow. This causes an increase in the collector resistance of the bipolar transistor. The switching speed thereof is thus lowered.

It is possible to make the collector contact region deeper. However, several additional steps are required for this purpose and the total number of manufacturing steps is greatly increased to raise the manufacturing cost.

SUMMARY OF THE INVENTION

Therefore, an object of the present invention is to provide a method of producing a Bi-MOS IC or Bi-CMOS IC in which the collector resistance of the bipolar transistor is lowered without greatly increasing the number of manufacturing steps.

The present invention is favorably applied to Bi-MOS or Bi-CMOS IC, whose MOS transistor has a gate electrode of polycrystalline silicon. The polycrystalline silicon gate is usually formed by depositing a polycrystalline silicon layer over the entire surface and then doping the layer with impurities for the purpose of lowering the resistance thereof, followed by selectively etching the layer to leave the pattern of the gate electrode. According to the present invention, a collector contact hole is formed before the polycrystalline silicon layer is deposited. Therefore, the impurities doped into the polycrystalline silicon layer are diffused through the collector contact hole into a collector region to form a collector contact region. The diffusion for the collector contact region further proceeds when source and drain regions and an emitter region are formed. As a result, the depth and impurity concentration of the collector contact region can be made greater than that of the source, drain and emitter regions.

Thus, by adding only the one step of forming the collector contact hole, a semiconductor device can be produced whose bipolar transistor has a lowered collector resistance while maintaining shallow junctions at the source and drain regions.

BRIEF DESCRIPTION OF THE DRAWINGS

The above and other objects, advantages and features of the present invention will be made apparent from the following description taken in conjunction with the accompanying drawings, in which.

DETAILED DESCRIPTION OF THE PREFERRED EMBODIMENTS

The present invention provides a Bi-MOS IC or a Bi-CMOS IC in which the high speed of the bipolar transistor and a small size of each transistor are realized without greatly increasing the manufacturing cost a first embodiment will be described with reference to FIGS. 1 to 8.

Figure 1:
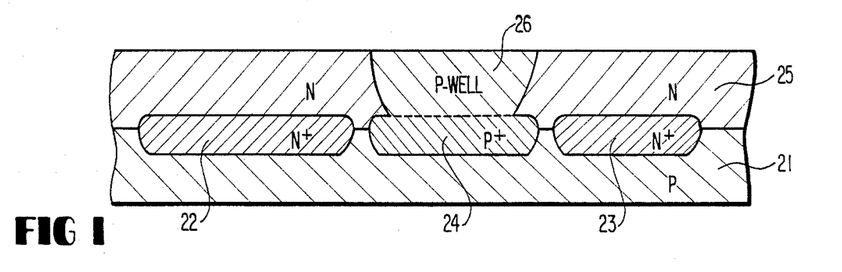
FIGS. 1 to 8 are cross-sectional views showing one embodiment according to the present invention.

Referring to FIG. 1, a P-type silicon substrate 21 having a resistivity of 10 $\Omega$-cm is prepared, into which aresenic as an N-type impurity and boron as a P-type impurity are selectively diffused to form N+-type buried regions 22 and 23 having a surface impurity concentration of $10^{19}$ cm$^{-3}$ and a P+-type buried region 24 having a surface impurity concentration of $10^{17}$ cm$^{-3}$, respectively. An N-type epitaxial layer 25 of 1 $\Omega$-cm is deposited over the substrate 21 having the buried regions 22 to 24. Boron ions are selectively implanted into the epitaxial layer 25, followed by drive-in diffusion, to form a P-type well region 26 reaching the P+-type buried region 24. The heat treatment for depositing the epitaxial layer 25 and that for the drive-in diffusion process allow the impurities in the buried regions 22 to 24 to diffuse upwardly into the epitaxial layer 25 as shown. Since the P-well region 26 is to be used as the substrate region of an N-channel MOS transistor, its impurity concentration takes a relatively low value, $10^{15}$ cm$^{-3}$. The right-hand portion of the epitaxial layer 25 with respect to the P-well region 26 is to be employed as a substrate region of a P-channel MOS transistor and the left-hand portion thereof with respect to the region 26 is to be employed as a collector region of a bipolar transistor.

Figure 2:
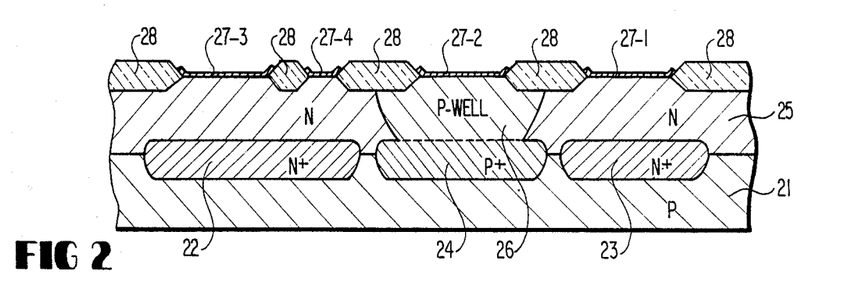

Referring to FIG. 2, silicon nitride films 27—1 to 27—4 to be used as oxidation-resist films are selectively deposited on the epitaxial layer 25 and the P-well region 26 via a thin silicon oxide film (not shown). The films 27—3 and 27—4 cover a base formation portion and a collector contact formation portion, respectively. Local oxidation of the exposed surface of the epitaxial layer is carried out while employing the nitride films 27 as a mask, so that thick silicon oxide films 28 as field insulators are formed with a thickness of about 6000 Å.

Figure 3:
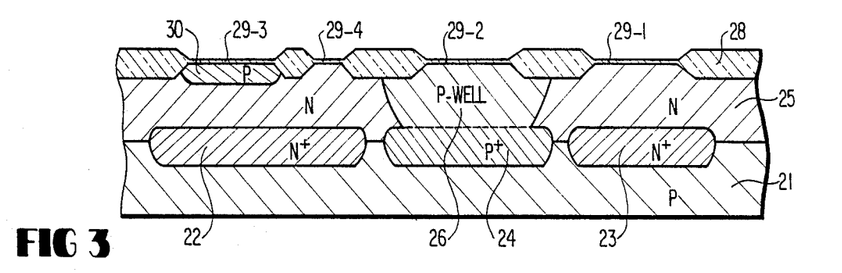

The silicon nitride films 27—1 to 27—4 and the silicon oxide films thereunder are thereafter removed, followed by gate oxidation. As shown in FIG. 3, gate oxide films 29—1 and 29—2 for P-channel and N-channel MOS transistors are thereby formed, and further the base formation portion and the collector contact formation portion are covered with oxide films 29—3 and 29—4, respectively. Boron ions as P-type impurities are implanted through the oxide film 29—3 into the base formation portion, followed by an annealing diffusion. As a result, a base region 30 is formed with a junction depth of 0.8 μm and a surface impurity concentration of about $10^{16}$ cm$^{-3}$.

Figure 4:
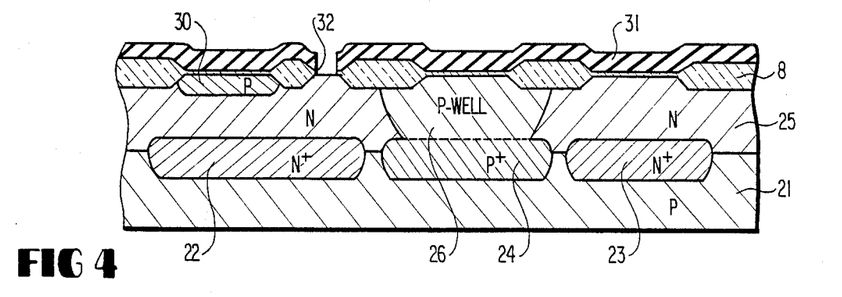

Thereafter, a collector contact hole is opened in the oxide film 29—4 in accordance with the present invention. For this purpose, as shown in FIG. 4, a photoresist film 31 is formed to cover the surface except for one at least one the oxide film 29—4, which is then exposed to a silicon oxide film etchant. As a result, a collector contact hole 32 is formed to expose a part of the collector contact formation portion.

Figure 5:
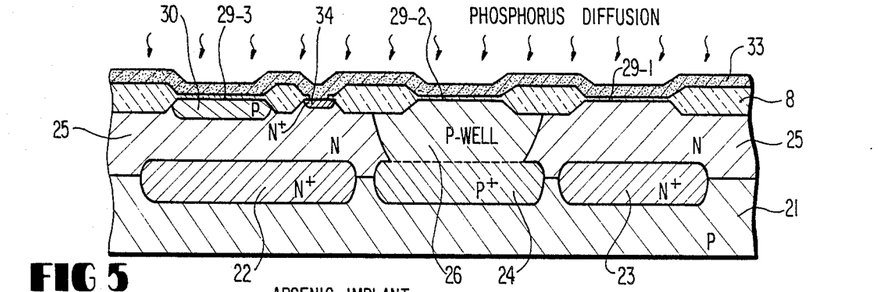

After the photoresist film 31 is removed, a polycrystalline silicon layer 33 is deposited over the entire surface, as shown in FIG. 5. N-type impuries are diffused into the polycrystalline silicon layer 33 in order to lower the resistance thereof. It is favorable to employ phosphorus as the impurity, because phosphorus has a large diffusion coefficient. Phosphorus is diffused into the polycrystalline silicon layer 33 to such an extent that the impurity concentration thereof is saturated ($10^{21}$ cm$^{-3}$). Phosphorus doped in the layer 33 goes through the contact hole 32 into the collector region of substrate, so that an N$^+$-type collector contact region 34 is formed with a high impurity concentration. The silicon oxide films 29—1 to 29—3 as well as the field oxide films 28 prevent phosphorus from reaching the P-well region 26, the base region 30 and the N-type substrate region.

Figure 6:
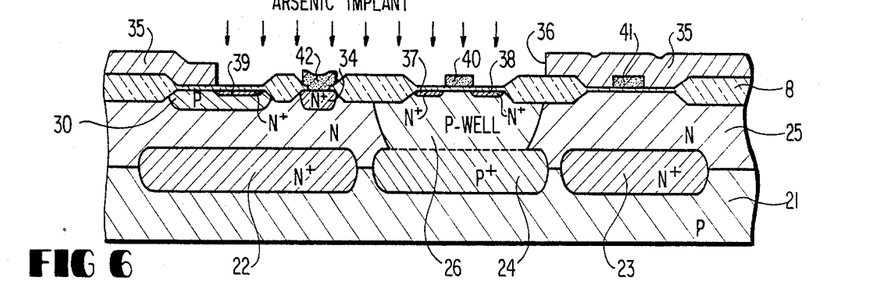

Referring to FIG. 6, the resistance-lowered polycrystalline silicon layer 33 is selectively removed to form the gate electrode 41 of the P-channel MOS transistor, the gate electrode 40 of the N-channel MOS transistor and the collector electrode 42 of the bipolar transistor. If desired, part of the layer 33 may be utilized as wiring conductors for interconnecting gate electrodes to each other or to other transistors (not shown). A mask layer 35 having an opening 36 and made of aluminum is thereafter deposited, and N-type impurity ions are then implanted through the opening 36 of the mask layer 35. The implantation energy is 50 KeV and the dosage is $5\times10^{15}$ cm$^{-2}$. Arsenic having a small diffusion coefficient is preferably employed. Antimony may be used, if desired. An annealing treatment is carried out to activate the implanted arsenic ions. As a result, a source regions 37 and a drain region 38 of the N-channel MOS transistor and an emitter region 39 of the bipolar transistor are formed simultaneously with a junction depth of about 0.3 μm. During this annealing treatment, phosphorus in the collector contact region 34 is re-diffused into the collector region. In addition, the impurity in the buried layer 22 is also re-diffused into the collector region. The polycrystalline layers 40 and 42 are also doped with the implanted ions.

Figure 7:
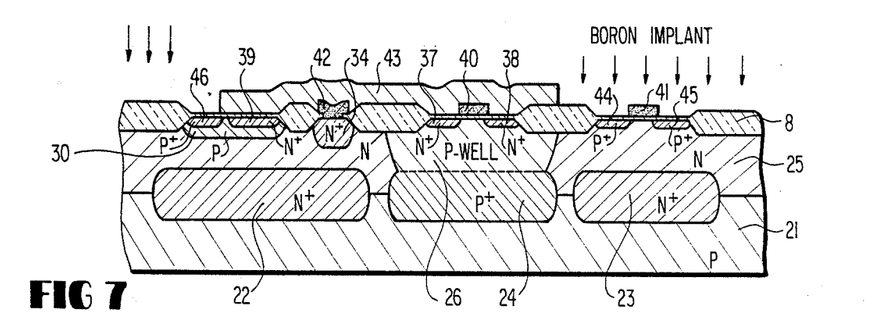

The mask layer 35 is removed and as shown in FIG. 7, a new mask layer 43 made of aluminum is deposited to protect the N-channel MOS transistor, the emitter region 39 and the contact region 34. Boron ions are then implanted with an implantation energy of 50 KeV and a dosage of $5\times10^{15}$ cm$^{-2}$. The implanted boron ions are activated by an annealing treatment, so that a source region 44 and a drain region 45 of the P-channel MOS transistor and a base contact region 46 are formed simultaneously with a depth of about 0.4 μm. This annealing treatment again allows phosphorus to re-diffuse again into the collector region. The collector contact region 34 is thereby made deeper. The impurities in the buried region 22 are again re-diffused upwardly into the collector region. On the other hand, arsenic has a diffusion coefficient smaller than that of phosphorus, and therefore the re-diffusion of the emitter regions 39 and the source and drain regions 37 and 38 is suppressed to maintain their shallow junctions.

Thus, the collector contact region 34 formed during the step of lowering the resistance of the polycrystalline silicon layer 33 (see FIG. 5) is made deeper than the emitter region 39 and the source and drain regions 37 and 38, as shown in FIG. 7, since phosphorus contained in the region 34 is re-diffused into the collector region by the subsequent annealing treatments. The impurity in the buried region 22 is arsenic, but the impurity concentration thereof is very high. Therefore, the thickness of the buried region 22 is made large. As a result, the distance between the collector contact region 34 and the buried region 22 is made small. In this embodiment, the collector contact region 34 is finally formed with a depth of 1 μm, and the buried region 22 is re-diffused upwardly into the epitaxial layer 25 to a depth of 2 μm. The thickness of the epitaxial layer 25 is 4 μm. Accordingly, the distance between the regions 34 and 22 takes a value of 1 μm. The collector resistance of the bipolar transistor having an emitter region 39 of a 20 μm$^2$ area is about 105 Ω.

Figure 8:
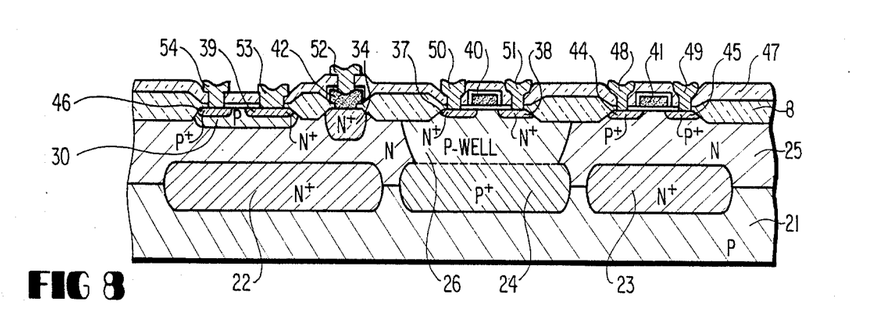

Referring to FIG. 8, the mask 43 is removed, and thereafter the polycrystalline silicon gates 40 and 41 and the polycrystalline silicon collector electrode 42 are covered with thin silicon oxide films. A protecting film 47 such as a silicon oxide film, a silicon nitride film or a phosphorus-silicate-glass (PSG) film is deposited over the entire surface. Electrode contact holes are opened in the film 47, and a metal such as aluminum is deposit to form the source electrode 50 and the drain electrode 51 of the N-channel MOS transistor, the source electrode 48 and the drain electrode 49 of the P-channel MOS transistor, and the emitter electrode 53, base electrode 54 and collector lead-out electrode 52 of the bipolar transistor.

As described above, adding only the simple step of forming the collector contact hole 32 before the deposition of the polycrystalline silicon layer 33 (see FIG. 4), there is produced a Bi-CMOS IC which includes a bipolar transistor having improved switching speed and P-channel and N-channel MOS transistors each having shallow source and drain regions.

With reference to FIG. 9 to FIG. 16, another embodiment of the present invention will be described. This embodiment includes improvements in further reducing the area of the bipolar transistor and enhancing isolation among the transistors. Therefore, the description will focus on these improvements, and the same constituents as in FIG. 1 to FIG. 8 are denoted by the same reference numerals. Moreover, the manufacturing steps shown in FIG. 9 to FIG. 16 correspond respectively to those shown in FIG. 1 to FIG. 8.

Figure 9:
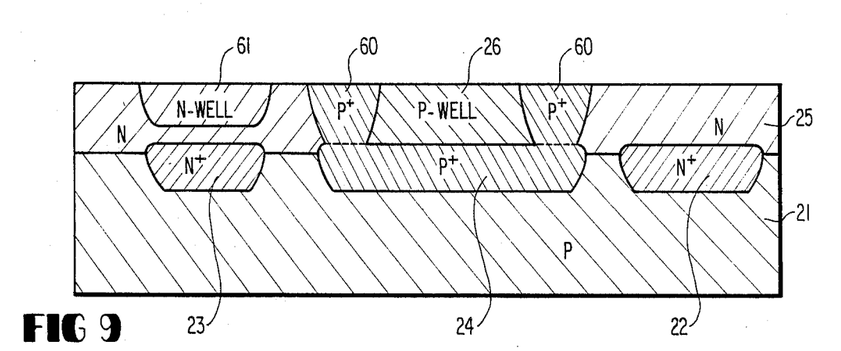
FIGS. 9 to 16 are cross-sectional views showing another embodiment of the present invention.

Referring to FIG. 9, boron ions are implanted in a large dosage into the epitaxial layer 25 to form a P+-type isolation region 60, and thereafter the P-well region 26 is formed inside of the isolation region 60. Subsequently, phosphorus ions are implanted in a small dosage to form an N-type well region 61 having a desired impurity profile for use as a substrate region of a P-channel MOS transistor.

Figure 10:
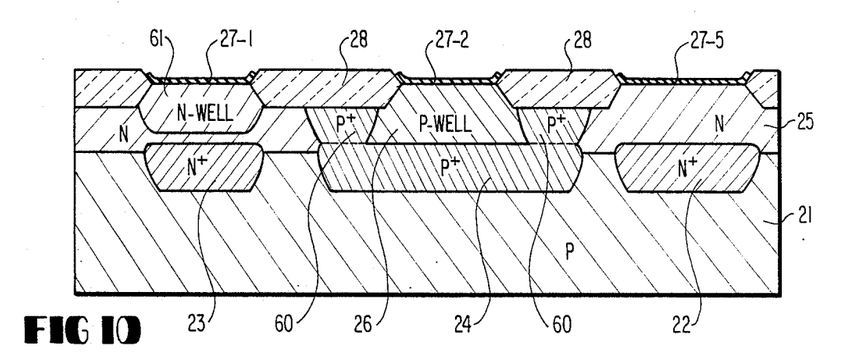

Local oxidation is carried out using silicon nitride films 27 as a mask to form field oxide film 28. In this embodiment, a silicon nitride film 25 covers the bipolar transistor formation section including base formation and collector contact formation portions, as shown in FIG. 10.

Figure 11:
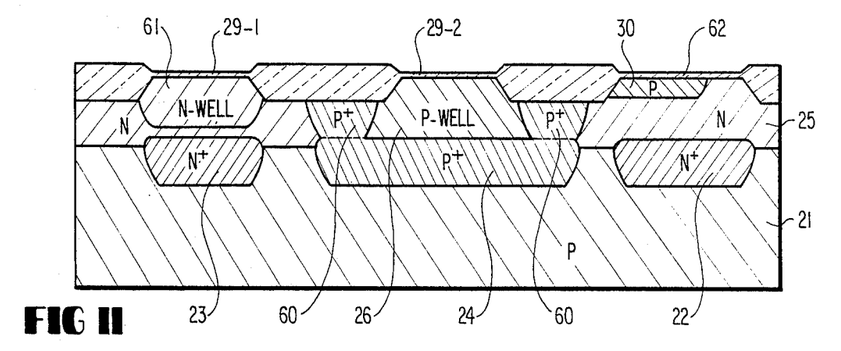

According to this embodiment, only the silicon nitride film 27—5 is removed and the remaining films 27—1 and 27—2 are left. Local oxidation is performed again under this condition to make a thick silicon oxide film covering the bipolar transistor formation section. The left silicon nitride films 27—1 and 27—2 are thereafter removed, followed by gate oxidation. As a result, as shown in FIG. 11, the P-well region 26 and the N-well region 61 are covered respectively with gate oxide films 29—2 and 29—1, whereas the bipolar transistor formation section is covered with a silicon oxide film 62 having a thickness larger than the gate oxide films 29. This structure may also be obtained by the following steps: The silicon nitride films 27—1, 27—2 and 27—5 are removed simultaneously and thermal oxidation is then carried out, followed by removing the oxidation films over the well regions 26 and 61 to then perform gate oxidation.

Since the silicon oxide film 62 is thick, the selective boron ion implantation forms a base region 30 shallower than that of the first embodiment.

Figure 12:
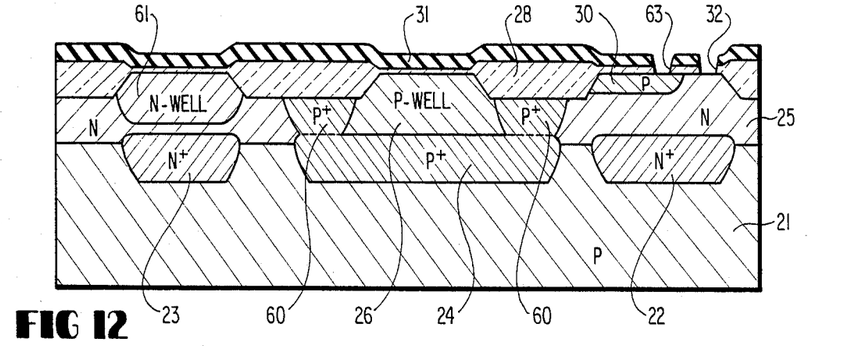

Referring to FIG. 12, a photoresist film 31 having two openings is formed and the oxide film 62 is then etched away selectively by using the photoresist film 31 as a mask. As a result, a collector contact hole 32 and an emitter contact hole 63 are opened in the film 62 to expose respective portions of the collector region and the base region 30.

Figure 13:
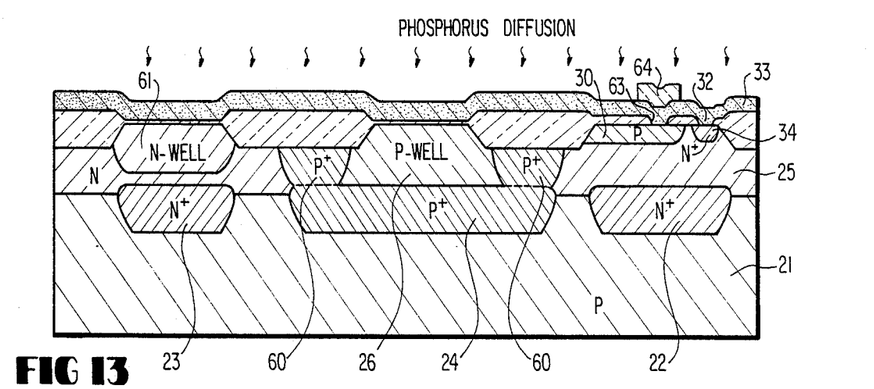

After the photoresist film 31 is removed, a polycrystalline silicon film 33 is deposited over the entire surface, as shown in FIG. 13. Phosphorus is diffused into the polycrystalline silicon film 33. At this time, a portion of the silicon layer 33 filling the emitter contact hole 63 is covered with a mask layer 64 made of silicon oxide, for example. Therefore, phosphorus forms a collector contact region 34 by passing through the contact hole 32, but it cannot pass through the hole 63.

Figure 14:
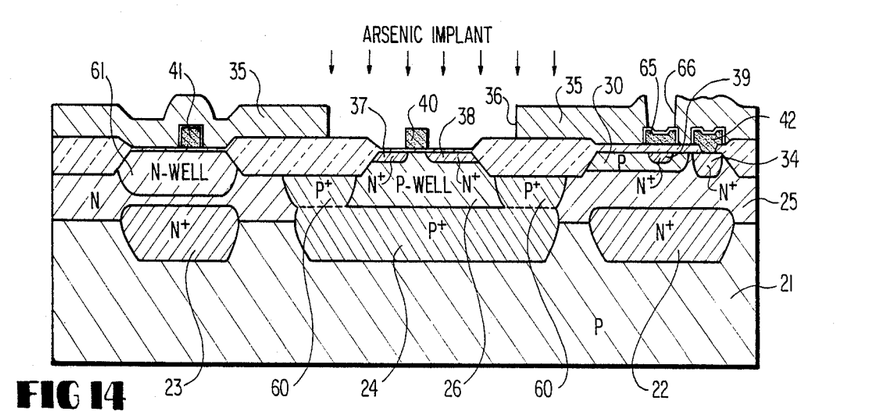

Referring to FIG. 14, the polycrystalline silicon layer 33 is selectively removed. A gate electrode 40 of the N-channel MOS transistor, a gate electrode 41 of the P-channel MOS transistor, and a collector contact electrode 42 of the bipolar transistor are thereby formed, and further a polycrystalline silicon layer 65 for the emitter electrode is formed. Since the layer 65 is not doped with phosphorus, the resistance thereof is extremely high. The polycrystalline silicon electrodes 40 to 42 and the layer 65 are oxidized to form thin silicon oxide films thereover. A mask layer 35 made of aluminum is thereafter deposited for the subsequent selective arsenic ion implantation. The mask layer 35 has an opening 36 for the N-channel MOS transistor as well as an opening 66 for the layer 65. The arsenic ion implantation is carried out, followed by the annealing treatment. An N-type source region 37 and drain region 38 are thereby formed, and the resistance of the layer 65 is lowered. Arsenic is diffused through the emitter contact hole 63 into the base region 30. As a result, an emitter region 39 and an emitter electrode 65' are formed.

Figure 15:
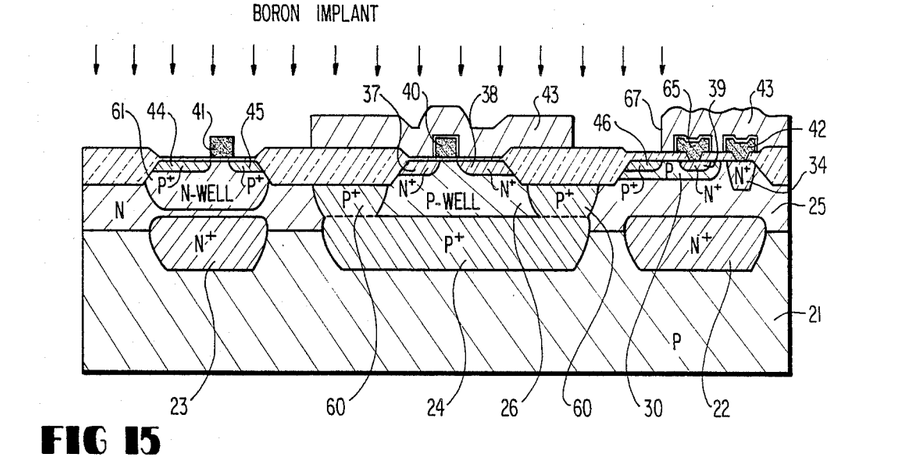

Referring to FIG. 15, a new mask layer 43 is deposited in place of the mask 35, and boron ions are then implanted, followed by the annealing treatment. As a result, P-type source region 44 and drain region 45 and a P-type base contact region 46 are formed.

Figure 16:
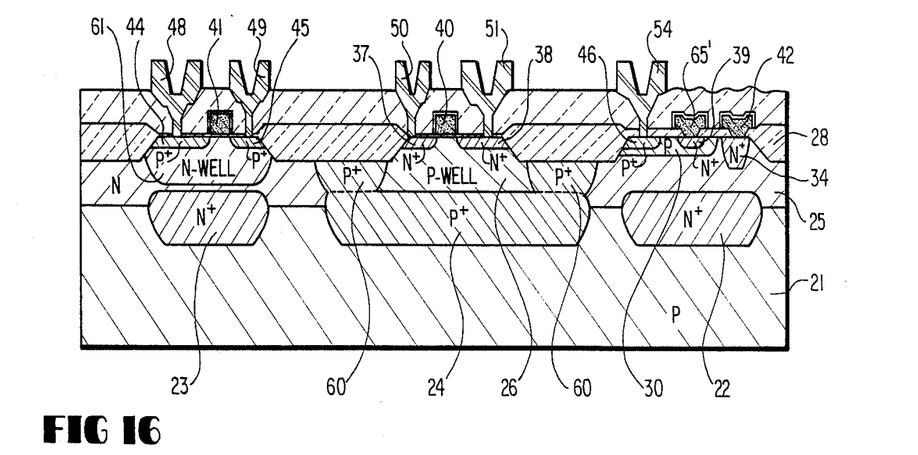

After the mask 43 is removed, a protective PSG film 47 is deposited over the entire surface, as shown in FIG. 16. Contact holes are opened in the PSG film 47 to form aluminum electrodes 49 to 51 and 54.

According to this embodiment, the collector contact hole 32 is formed before the deposition of the polycrystalline silicon layer 33, and therefore the collector resistance of the bipolar transistor is lowered as mentioned hereinbefore. Moreover, the base region 30 is formed with a shallow junction and the field oxide film 28 between the base region 30 and the collector contact region 34 (see FIG. 2) is not required, so that the bipolar transistor is formed with a reduced size. The integration density is thus further increased.

Since the oxide film 62 is thicker than the gate oxide films 29, the arsenic ions implanted for the shallow source and drain regions 37 and 38 and the emitter 39 may not reach the base region 30 in spite of the opening 66. Therefore, an emitter contact hole 63 is formed simultaneously with the collector contact hole 32, and arsenic is diffused through the layer 65 and emitter contact hole 63 into the base region 30.

Although each described embodiment of the present invention is a Bi-CMOS IC, the present invention is applicable to a Bi-MOS IC including a bipolar transistor and a P-channel or N-channel MOS transistor. An insulative substrate may be employed in place of the silicon substrate. In the above embodiments, the polycrystalline silicon film 33 is doped with phosphorus before patterning it to form the collector electrode 42 and the gate electrodes 40 and 41 (see FIGS. 5 and 6 and FIGS. 13 and 14). However, the polycrystalline silicon film 33 can be patterned first and thereafter phosphorus doped into the patterned the polycrystalline silicon layers to form the collector contact region, the collector electrode and the gate electrodes. An impurity doped polycrystalline silicon film may be used in place of non-doped polycrystalline silicon film 33.

What is claimed is:

1. A method for producing semiconductor device of a type in which a bipolar transistor and an insulated gate field effect transistor are formed on one chip, said method comprising the steps of:
    forming a collector region of said bipolar transistor of one conductivity type and a substrate region of said insulated gate field effect transistor of the opposite conductivity type in said chip,
    forming an insulating layer on said collector region and said substrate region,
    forming a base region in said collector region,
    forming a collector contact hole in said insulating layer to selectively expose said collector region,
    depositing a polycrystalline silicon layer over said insulating layer so as to fill said collector contact hole,
    diffusing first impurities into said polycrystalline silicon layer, to lower the resistance thereof, and, simultaneously, into said collector region through said collector contact hole to form a collector contact region in said collector region,
    selectively removing said polycrystalline layer to form a gate electrode of said insulated gate field effect transistor and a collector electrode of said bipolar transistor, said collector electrode contacting said collector contact region through said collector contact hole, and selectively doping second impurities into the polycrystalline silicon collector electrode, said base region and said substrate region to form an emitter region of said bipolar transistor and source and drain regions of said insulated gate field effect transistor, said first impurities in said collector contact region being further diffused into said collector region during the formation of said emitter, source and drain regions, such that the depth of said collector region becomes larger than said emitter, source and drain regions.

2. The method as claimed in claim 1, wherein said first impurities have a diffusion coefficient larger than the diffusion coefficient of said second impurities.

3. A method of producing an integrated circuit device including a bipolar transistor, a first insulated gate transistor of a first channel type and a second insulated gate transistor of a second channel type on a single wafer, comprising the steps of forming a collector region of said bipolar transistor in said wafer, forming a first substrate region of said first insulated gate transistor in said wafer, forming a second substrate region of said second insulated gate transistor in said wafer, covering said collector region, said first substrate region and said second substrate region with an insulating film, forming a collector region, depositing a polycrystalline silicon layer making contact with a part of said collector region through said collector contact hole and extending over said insulating film, doping a first impurity, which is contained in said polycrystalline silicon layer, into said collector region from said polycrystalline silicon layer through said collector contact hole to form a collector contact region in said collector region, patterning said polycrystalline silicon layer to form a collector electrode filling said collector contact hole and first and second gate electrodes above said first and second substrate regions, respectively; forming, by selective doping of a second impurity into said base region and said first substrate region, an emitter region of said bipolar transistor and source and drain regions of said first insulated gate transistor, and forming, by selective doping of a third impurity into said second substrate region, source and drain regions of said second insulated gate transistor, said first impurity being further diffused into said collector region by the step of forming said emitter region of said bipolar transistor and said source and drain regions of said first insulated gate transistor and by the step of forming said source and drain regions of said second insulated gate transistor, such that said collector contact region is made deeper than said emitter region and said source and drain regions of said first insulated gate transistor.

4. A method of producing a semiconductor integrated circuit device, comprising the steps of selectively forming, in a surface area of a semiconductor substrate of one conductivity type, first and second high concentration regions of an opposite conductivity type and a third high concentration region of said one conductivity type, growing an epitaxial layer of said opposite conductivity type on the surface of said substrate and said first to third high concentration regions, forming in said epitaxial layer a well region of said one conductivity type reaching said third high concentration region, selectively forming field insulating layers partially embedded in said epitaxial layer and said well region to form a collector region of a bipolar transistor and a first substrate region of a first channel type insulated gate field effect transistor in said epitaxial layer and a second substrate region of a second channel type insulated gate field effect transistor in said well region, said collector region and said first substrate region lying on said first and second high concentration regions, respectively; covering the surfaces of said collector region, said first substrate region and said second substrate region with first, second and third thin insulating films, respectively, forming a base region in said collector region, forming a collector contact hole in said first insulating film to expose a part of said collector region, depositing a polycrystalline silicon layer over the entire surface of the device to fill said collector contact hole, doping first impurities into said polycrystalline silicon layer to lower the resistance thereof, a part of said first impurities being diffused by said first impurity doping step into said collector region through said collector contact hole to form a collector contact region in said collector region, selectively removing said polycrystalline silicon layer to form a collector electrode connected to said collector contact region, a first gate electrode on said second thin insulating film and a second gate electrode on said third insulating film, selectively doping second impurities having a diffusion coefficient smaller than that of said first impurities into said base region and said second substrate region to form an emitter region and source and drain regions of said second channel type insulated gate field effect transistor, and selectively doping third impurities into said base region and said first substrate region to form a base contact region and source and drain regions of said first channel type insulated gate field effect transistor, the diffusion of said first impurities into said collector region being promoted by the formation of said source and drain regions of said first channel type insulated gate field effect transistor and said source and drain regions of said second channel type insulated gate field effect transistor.

5. The method as claimed in claim 4, wherein said first impurities are phosphorous, said second impurities are one of arsenic and antimony, and said third impurities are boron.

6. A method of producing a semiconductor integrated circuit device, comprising selectively forming in a surface portion of a P-type semiconductor substrate first and second buried regions of an N-type and a third buried region of said P-type, growing an epitaxial layer of said N-type on the surfaces of said substrate and said first to third buried regions, forming in a first poriton of said epitaxial layer a first well region of said N-type facing said first buried region, forming in a second portion of said epitaxial layer a second well region of said P-type reaching the surface of said third buried region, forming a third insulating film on a third portion of said epitaxial layer which lies on said second buried region, selectively forming a base region in said third portion of said epitaxial layer, forming in said third insulating film a collector contact hole and an emitter contact hole with expose a part of said third portion of said epitaxial layer and a part of said base region, respectively, depositing over the entire surface a polycrystalline silicon layer having a first portion filling said collector contact hole and a second portion filling said emitter contact hole, covering said second portion of said polycrystalline silicon layer with a mask layer, doping phosphorous into said polycrystalline silicon layer to lower the resistance thereof, said phosphorus doped in said first portion of said polycrystalline silicon layer being diffused into said third portion of said epitaxial layer through said collector contact hole to form a collector contact in said third portion of said epitaxial layer, and said mask layer preventing said phosphorus form being doped in said second portion of said polycrystalline silicon layer, selectively removing said polycrystalline silicon layer to form first and second polysilicon gate electrodes on said first and second insulating films, respectively, and so as to leave said first and second portions of said polycrystalline silicon layer, doping arsenic in said second well region and said second portion of said polycrystalline silicon layer to form source and drain regions of said N-type in said second well region and an emitter region in said base region, and doping boron in said first well region and in said base region to form source and drain regions of said P-type and a base contact region in said base region, the diffusion of said phosphorus into said third portion of said epitaxial layer progressing during the formation of said source and drain regions.

* * * * *